(12) United States Patent
Iriguchi et al.

(10) Patent No.: US 6,444,923 B1
(45) Date of Patent: Sep. 3, 2002

(54) METHOD OF CONNECTING PRINTED WIRING BOARDS WITH EACH OTHER, AND PRINTED CIRCUIT BOARD

(75) Inventors: Shigeo Iriguchi; Satoshi Watanabe; Yoshitaka Muraoka, all of Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/585,340

(22) Filed: Jun. 2, 2000

(30) Foreign Application Priority Data

Oct. 27, 1999 (JP) .............................. 11-305676

(51) Int. Cl.⁷ ................................................ H01R 9/09
(52) U.S. Cl. ...................... 174/261; 174/268; 29/847; 361/760; 361/791
(58) Field of Search ............................. 439/79, 66, 69, 439/290, 85, 67, 284, 285, 493; 174/260, 261, 268; 361/748, 749, 760, 791; 29/827, 846, 847

(56) References Cited

U.S. PATENT DOCUMENTS 5,358,412 A * 10/1994 Maurinus et al. ............. 439/66
5,643,835 A * 7/1997 Chia et al. .................. 437/211
5,691,509 A * 11/1997 Balzano ................... 174/117 F
5,938,455 A * 8/1999 Glovatsky et al. ............. 439/74
6,045,368 A * 4/2000 Cadenhead et al. ........... 439/67

FOREIGN PATENT DOCUMENTS

| JP | 8-37397 | 2/1996 |
| TW | 86214443 | 8/1997 |

OTHER PUBLICATIONS

Office Action of corresponding Taiwanese application, 89111318, dated Nov. 21, 2001, with English translation.

* cited by examiner

*Primary Examiner*—Albert W. Paladini
(74) *Attorney, Agent, or Firm*—Armstrong, Westerman & Hattori, LLP

(57) ABSTRACT

At one end of a printed wiring board, there is formed a narrow-pitched electrode pattern and engagement patterns made of the same material as that of the electrode pattern. At one end of an FPC which is to be connected with the printed circuit board, there is formed a narrow-pitched electrode pattern and engagement patterns made of the same material as that of the electrode pattern. The engagement patterns in the printed wiring board being engageable with the engagement patterns in the FPC. When the two engagement patterns are engaged with each other, the electrode pattern of the printed wiring board is electrically connected with the electrode pattern of the FPC.

12 Claims, 15 Drawing Sheets

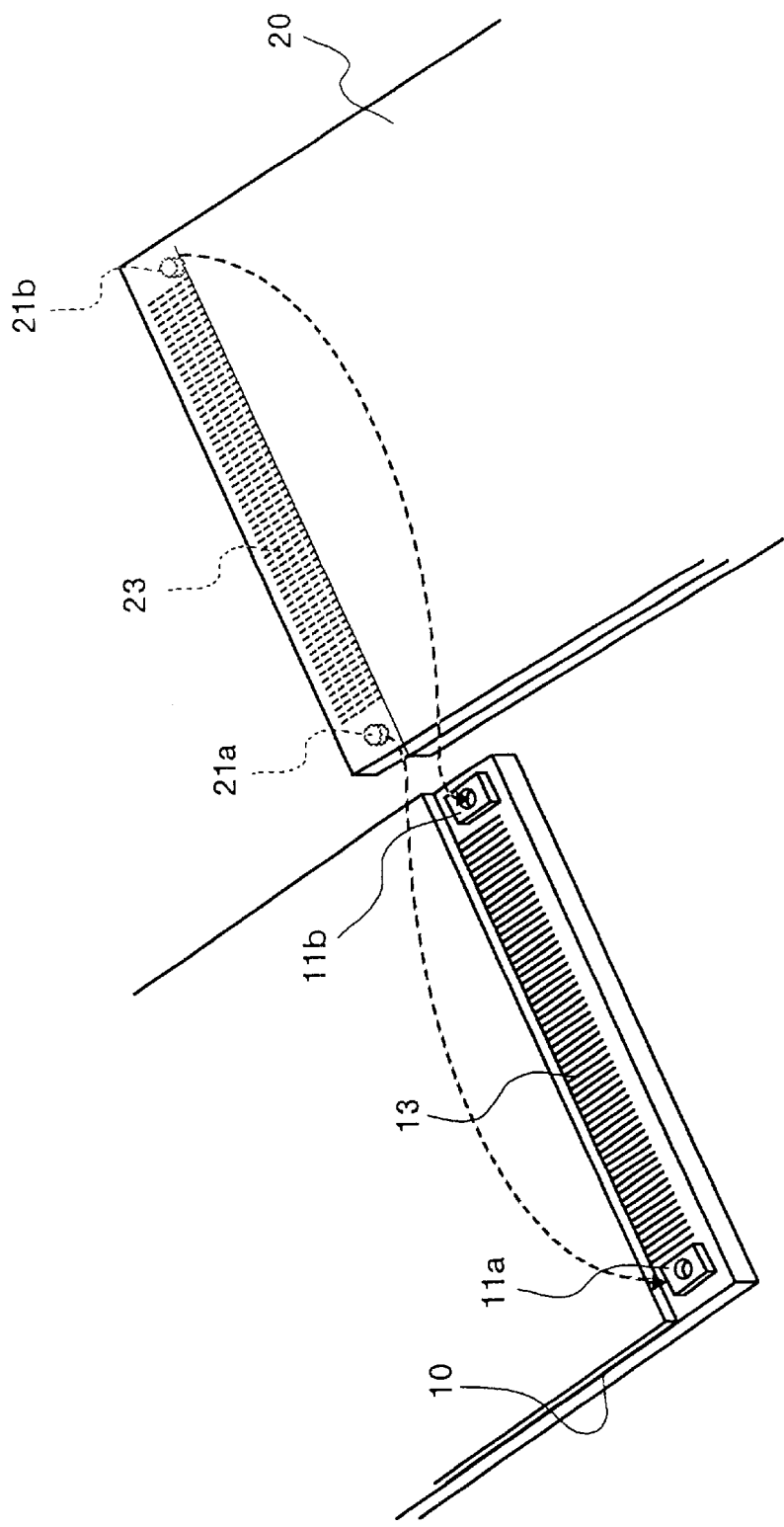

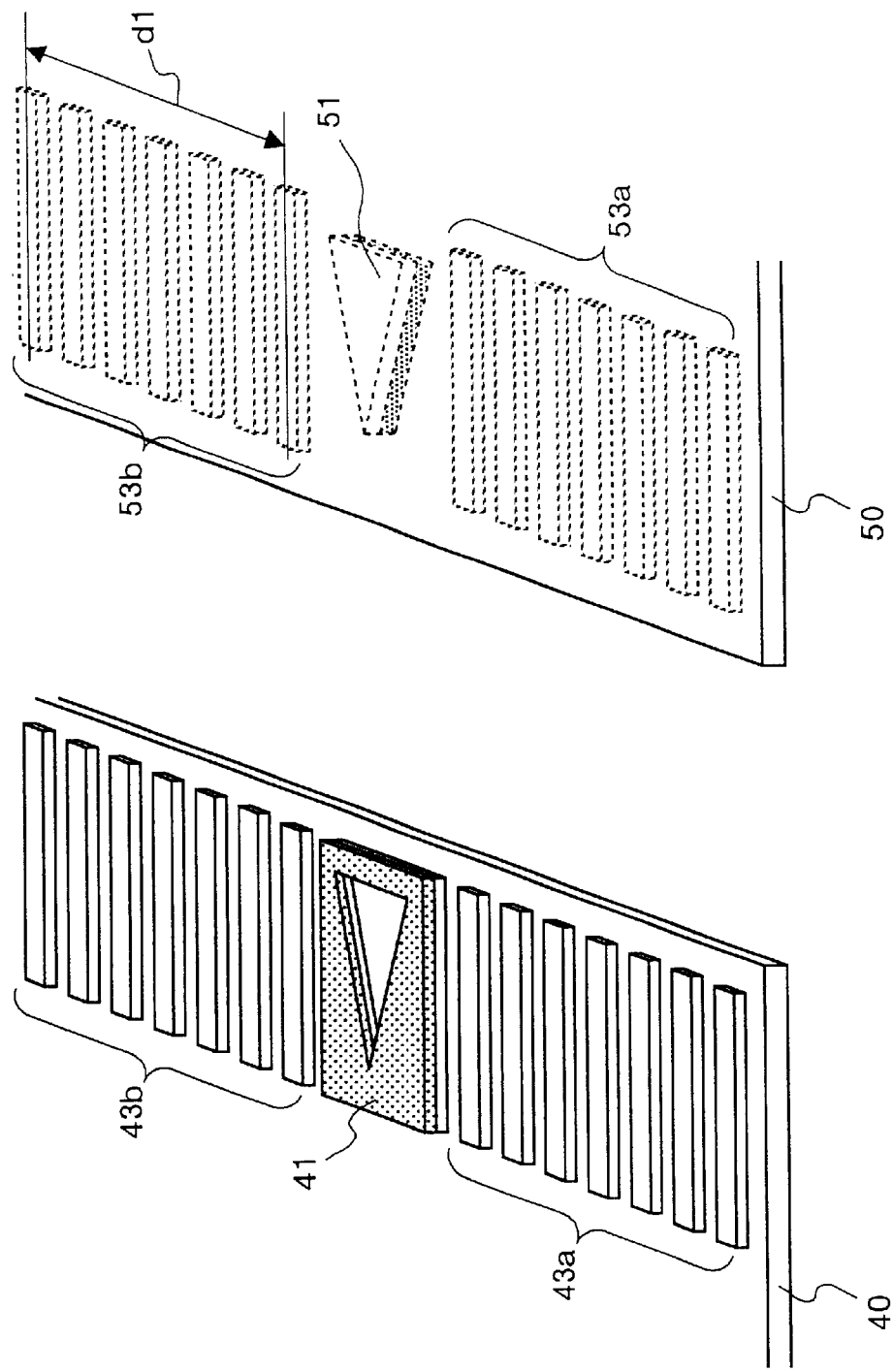

METHOD OF CONNECTING PRINTED WIRING BOARDS WITH EACH OTHER, AND PRINTED CIRCUIT BOARD

FIELD OF THE INVENTION

The present invention relates to a method of connecting two printed wiring boards with each other through an electrical connection of respective electrode patterns formed by electrodes that are disposed in high density, and to a printed circuit board provided by the connection between these printed wiring boards based on this connection method. Particularly, this invention relates to a method of connecting the printed wiring boards with each other that is capable of easily and precisely positioning the electrode patterns and is also capable of fixing the electrode patterns after the positioning, and to the printed circuit board provided by this connection.

BACKGROUND OF THE INVENTION

In recent years, there has been an increasing market demand for thinner and smaller sizes of semiconductor devices as represented by CPUs and memory ICs that are mounted on an electronic apparatus. Various efforts have been made to meet such demand for smaller sizes and higher functions. In realizing the smaller sizes and higher functions, the CPUs and memory ICs have a large number of electrodes (lead frames) disposed on the periphery of the packages to have electrical connections with external units like semiconductor devices/elements in order to perform signal transmission/reception between them.

Inside the packages of the CPUs and ICs, there are going on connections between chips that function as cores and the large number of lead frames at high speed and in high precision by solder bumper or wire bonding, as a part of the process of manufacturing semiconductors. Further, at the outside of the packages, there are normally mounted as functional modules a large number of CPUs, memory ICs and semiconductors in high precision on one printed circuit board. As they are located at mutually close positions, their lead frames are also electrically connected with no problem on the printed circuit board to form high-precision and high-density wiring patterns.

In the mean time, in the technical field of display units that function as output interfaces with users, there have been developed matrix-display type display units such as liquid displays and plasma displays for realizing thin types and lower power consumption in place of the conventional CRT displays. In recent years, the needs for higher resolution and larger screens of these displays have been increasing. In order to meet the needs, various developments have also been progressed.

In such a matrix-display type display unit, a display panel composed of a plurality of pixel elements is usually formed separately from a control unit that controls the display of images. Particularly, on each display panel, there are laid out a large number of electrodes to achieve signal transnission/reception to/from the control unit, corresponding to the number of pixel elements that make displays. Therefore, in order to achieve the above-described higher resolution and larger screens, it is necessary to provide a larger number of electrodes (hereinafter to be referred to as an electrode pattern).

However, this electrode pattern is required to be integrated in compact as far as possible in consideration of a limited area of the display panel and easiness of connecting the display panel with the control unit. Accordingly, it becomes necessary to reduce a distance between adjacent electrodes that structure the electrode pattern. In other words, it is necessary to narrow the pitch of the electrode pattern.

Further, other types of electronic apparatus may also be constructed to have a plurality of printed circuit boards that have the narrow-pitched electrode patterns. In many cases, functions to be achieved by the printed circuit boards are provided in the form of modules on each printed circuit board. In the actual transactions, in many cases, these printed circuit boards are supplied by different makers.

Therefore, for achieving electrical connection of the electrode patterns between the printed circuit boards that have the narrow-pitched electrode patterns, there are usually used printed wiring boards such as FPCs (flexible printed circuits). There is also a case where the printed circuit boards are directly connected with each other by using a connector. Therefore, in order to connect a printed circuit board with a printed wiring board, or to connect printed circuit boards with each other, there has been required a method that can achieve an easy and precise positioning of mutually narrow-pitched electrode patterns.

In the following description of connection methods, there will be no distinction between the connection between a printed circuit board and a printed wiring board and the connection between two printed circuit boards. The description will be made based on the connection between printed wiring boards.

FIG. 1A to FIG. 1C explain a conventional method of connecting a printed wiring board with another printed wiring board. Particularly, these figures show an example of connecting a plasma display panel with an FPC. As shown in these figures, for connecting the printed wiring board with the FPC, each having a high-density electrode pattern, the electrode patterns are directly positioned based on visual observation. The printed wiring boards connected are then fixed.

The connection is carried out as follows. First, a tape 215 is adhered in advance onto the surface of an electrode pattern 213 of an FPC 210 as shown in FIG. 1A. Based on a visual observation, an electrode pattern 203 of a printed wiring board 200 and an electrode pattern 213 of the FPC 210 are positioned together to achieve a mutual electrical connection.

The tape 215 provisionally fixes the printed wiring board 200. A pressing metal member 220 is then applied to the electrode pattern 213 of the FPC 210, as shown in FIG. 1B. Spring clips 230 are applied to sandwich the pressing metal member 220, the printed wiring board 200 and the FPC 210 together, as shown in FIG. 1C. Thus, the printed wiring board 200, the FPC 210 and the pressing metal member 220 are fixed integrally.

In this way, the electrode pattern 203 of the printed wiring board 200 and the electrode pattern 213 of the FPC 210 are electrically connected and fixed together.

As another conventional method of connecting between printed wiring boards, there is disclosed "A method of positioning a printed wiring board and parts" in Japanese Patent Application Laid-open No. 8-37397. According to this method, a positioning pattern is formed on a printed wiring board, and a solder is adhered to this positioning pattern to form projections. These projections are then engaged with holes provided on parts that are to be positioned (electric parts and other printed wiring board or the like). Thus, the parts are disposed on the printed wiring board.

Based on the above method, it is not necessary to prepare a tool equipped with positioning pins that have been conventionally required. It is not necessary to form positioning holes on the printed wiring board either. As compared with the conventional methods of positioning a printed wiring board and parts, this method can improve the precision of the positioning.

However, according to the above conventional methods of connecting between printed wiring boards, there is no reference of positioning other than electrode patterns. Therefore, it has been necessary to directly position narrow-pitched electrode patterns based on a visual observation. As a result, there have frequently occurred positional deviations between the electrode patterns. Thus it has been necessary to carefully confirm the connection between the printed wiring boards after the fixing by the clips 230.

Further, in fixing between the printed wiring boards after the positioning, it is necessary to use a plurality of independent parts such as the pressing metal member 220 and the spring clips 230. This makes the fixing work complex, and also requires many fitting processes, which has lowered the productivity.

The above "A method of positioning a printed wiring board and parts" is a method of positioning based on the formation of a plurality of projections by solder and the holes of the parts. As the holes of the parts are usually formed mechanically, in many cases the tolerance becomes larger than the pitches of the high-density electrode patterns. As a result, after the printed wiring board and the parts have been positioned, the precision of the positioning between the respective electrode patterns is lowered. Thus, it has been difficult to achieve a precise positioning.

SUMMARY OF THE INVENTION

It is an object of the present invention to facilitate a precise positioning between printed wiring boards that have narrow-pitched electrode patterns respectively, and to facilitate a secure fixing of the connected printed wiring boards after the positioning.

In order to achieve the above object by solving the above problems, according to one aspect of the present invention, there are provided a method of connecting between printed wiring boards, and a printed circuit board having printed wiring boards connected based on this connection method, as follows. This method has a process of forming at one end of a first printed wiring board a first electrode pattern together with first engagement patterns made of the same material as that of the first electrode pattern near this first electrode pattern; and a process of forming at one end of a second printed wiring board a second electrode pattern together with second engagement patterns made of the same material as that of the second electrode pattern near this second electrode pattern, the second engagement patterns being engageable with the first engagement patterns. Therefore, it is possible to easily obtain engagement patterns having high-precision shapes without separately providing a new process.

According to the above invention, when the first engagement patterns are engaged with the second engagement patterns, it is possible to position the electrode patterns so that the first electrode pattern is electrically connected with the second electrode pattern.

According to another aspect of the invention, there are provided a method of connecting between printed wiring boards, and a printed circuit board having printed wiring boards connected based on this connection method, as follows. This method has a process of forming first engagement patterns by plating on a part of a first electrode pattern at one end of a first printed wiring board; and a process of forming second engagement patterns by plating on a part of a second electrode pattern at one end of a second printed wiring board.

According to the above invention, when the first engagement patterns are engaged with the second engagement patterns, it is possible to position the electrode patterns so that the first electrode pattern is electrically connected with the second electrode pattern.

According to still another aspect of the invention, there are provided a method of connecting between printed wiring boards, and a printed circuit board having printed wiring boards connected based on this connection method, as follows. This method has a process of forming at one end of the first printed wiring board a covering material that covers an upper surface of a first printed wiring board other than a portion of the upper surface where a first electrode pattern is electrically connected so that one end of the covering material positioned at the first electrode pattern side has a first rugged part in a direction parallel with the surface of the first printed wiring board; and a process of forming a covering material that covers an upper surface of a second printed wiring board other than a portion of the upper surface where a second electrode pattern is electrically connected at one end of the second printed wiring board so that one end of the covering material positioned at the second electrode pattern side has a second rugged part in a direction parallel with the surface of the second printed wiring board.

According to the above invention, when the first rugged part is engaged with the second rugged part, it is possible to position the electrode patterns so that the first electrode pattern is electrically connected with the second electrode pattern.

Other objects and features of this invention will become apparent from the following description with reference to the accompanying drawings.

BRIEF DESCRIPTION OF THE DRAWINGS

FIG. 2 is a diagram for explaining a method of connecting between printed wiring boards relating to a first embodiment of the present invention.

FIG. 6 is a diagram for explaining a method of connecting between printed wiring boards relating to a second embodiment of the present invention.

DESCRIPTION OF THE PREFERRED EMBODIMENTS

Figure 1A:
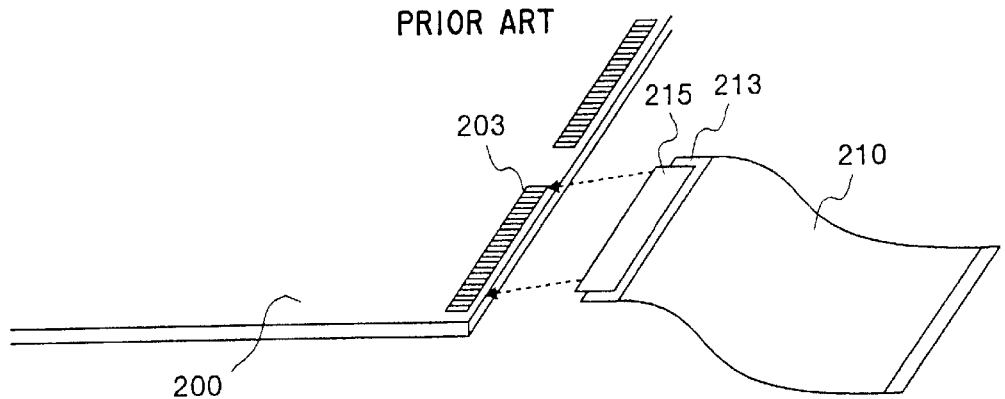
FIG. 1A to FIG. 1C explain a conventional method of connecting between printed wiring boards.
Figure 1B:
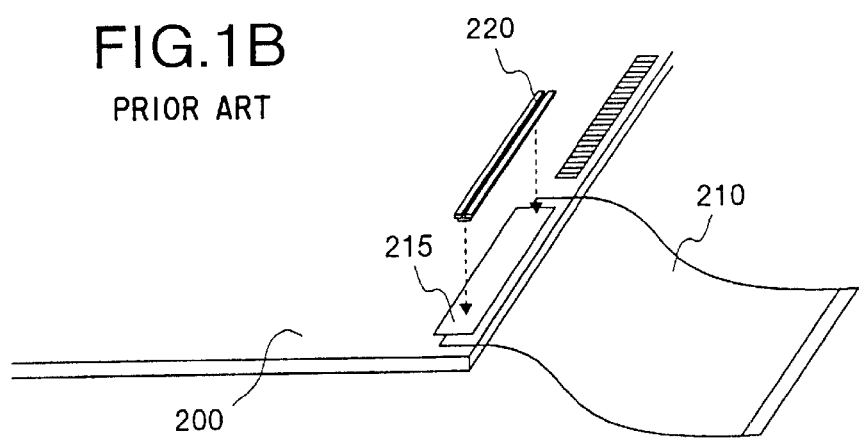
Figure 1C:
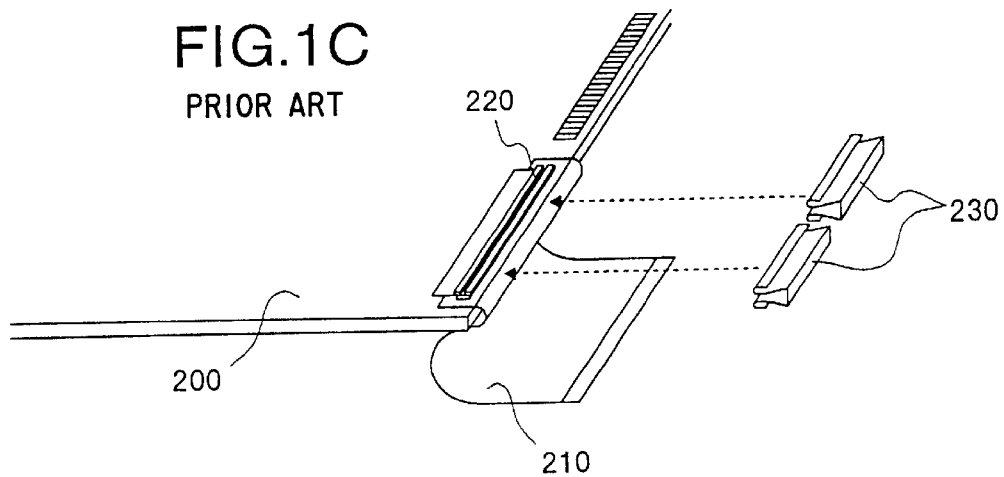

Preferred embodiments of a method of connecting between printed wiring boards and a printed circuit board relating to the present invention will be explained in detail below with reference to the attached drawings. The present invention is not limited to these embodiments. A connection between a printed wiring board made of a glass epoxy resin and the FPC will be explained as examples of connection between printed wiring boards.

A method of connecting between printed wiring boards, and a printed circuit board relating to a first embodiment will be explained first. According to the method of connecting between printed wiring boards relating to the first embodiment, engagement patterns of the same materials are formed near electrode patterns of two printed wiring boards for achieving an electrical connection at the same time when these printed wiring boards are formed. These engagement patterns are engaged with each other at the time of connecting between the printed wiring boards. The engagement patterns are engaged with each other by mutual contact from up and down directions. The up and down directions mean the directions in which the surfaces of the two printed wiring boards are superimposed with each other. In other words, these are the directions in which the surfaces of the two printed wiring boards face each other.

FIG. 2 explains the method of connecting printed wiring boards with each other relating to the first embodiment of the present invention. As shown in FIG. 2, an electrode pattern 13 formed by a plurality of narrow-pitched electrodes laid out at an end of a printed circuit board 10 is electrically connected with a narrow-pitched electrode pattern 23 laid out at an end of an FPC 20. In other words, these electrode patterns 13 and 23 are constructed of electrodes so that each one electrode corresponds to the other one electrode at one to one. A predetermined signal is transmitted at each one of these connection points.

The electrode pattern 13 of the printed circuit board 10 is formed as a plurality of narrow-pitched electrodes from a metal material such as copper or the like by photolithography or other technique. In this process of forming the electrode pattern, there are also formed engagement patterns 11a and 11b as shown in FIG. 2 at the same time when the electrode pattern 13 is formed. More specifically, in a photoetching process for forming a metal wiring pattern, a mask pattern consisting of a pattern of the electrode pattern 13 and a pattern of the engagement patterns 11a and 11b are used.

Similarly, in the FPC 20, there are also formed engagement patterns 21a and 21b at the same time when the electrode pattern 23 is formed as shown in the drawing. The engagement patterns 11a and 21a are formed in shapes that are engageable from the up and down directions as described above. The shapes of the engagement patterns 11a and 21a are mutually different. The engagement patterns 11b and 21b also have shapes that can be engaged with each other in a similar manner to that of the engagement patterns 11a and 21a.

As shown in FIG. 2, for example, it may be so arranged that the engagement patterns 11a and 11b are formed in metal patterns each having a circular recess at the center, and the engagement patterns 21a and 21b are formed in metal patterns each having a circular flange to achieve an engagement between the engagement patterns 11a and 21a and between the engagement patterns 11b and 21b respectively.

Figure 3A:
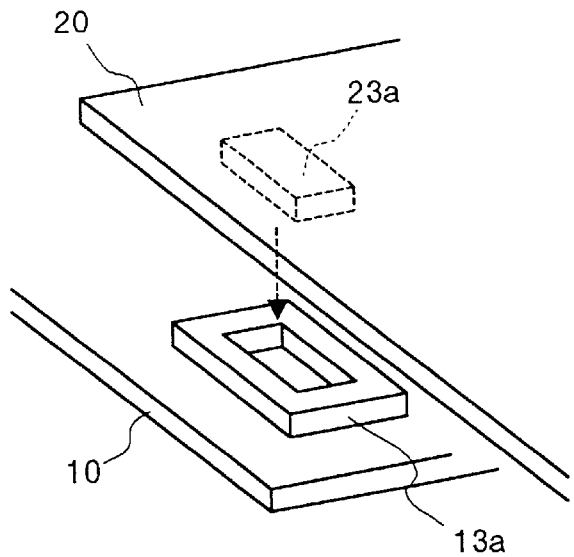
FIG. 3A and FIG. 3B are diagrams for explaining other engagement patterns in the method of connecting between printed wiring boards relating to the first embodiment.
Figure 3B:
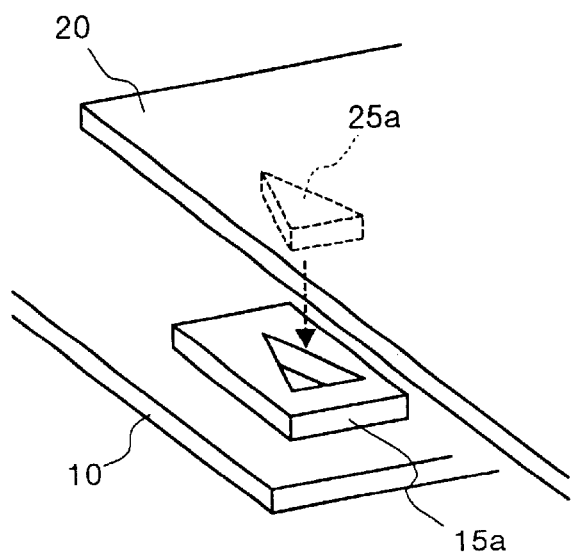

These engagement patterns may be in shapes that can achieve an engagement from up and down directions. Therefore, it is also possible to select other patterns than the circular recess and flange. FIG. 3A and FIG. 3B show the other engagement patterns in the method of connecting between printed wiring boards relating to the first embodiment. As shown in FIG. 3A, for example, the engagement patterns of the printed circuit board 10 and the FPC 20 may be formed to have a square recess 13a and a square flange 23a respectively. Alternatively, the engagement patterns of the printed circuit board 10 and the FPC 20 may be formed to have a triangular recess 15a and a triangular flange 25a respectively as shown in FIG. 3B.

In FIG. 2, the engagement patterns 11a and 11b may be in different engagement patterns. For example, the engagement patterns 11a and 21a may take the square recess 13a and the square flange 23a respectively as shown in FIG. 3A, and the engagement patterns 11b and 21b may take the triangular recess 15a and the triangular flange 25a respectively as shown in FIG. 3B.

It is desirable that these engagment patterns are formed near both ends of the electrode pattern respectively, that is, at two positions on both ends of the electrode pattern as shown in FIG. 2. This is for the following reasons. There are relatively large of the electrode pattern, as other electrodes or semiconductors are not usually disposed in these areas. The FPC 20 is usually transparent except at portions where electrodes are disposed. Therefore, it is possible to confirm relative positions between the electrode pattern 13 of the printed circuit board 10 and the FPC 20 by looking at the electrode pattern 13 through the transparent surface of the surface of the FPC 20. It is, therefore, possible to confirm relative positions between the engagement patterns as well as to confirm relative positions between the electrode patterns at the same time.

Figure 4A:
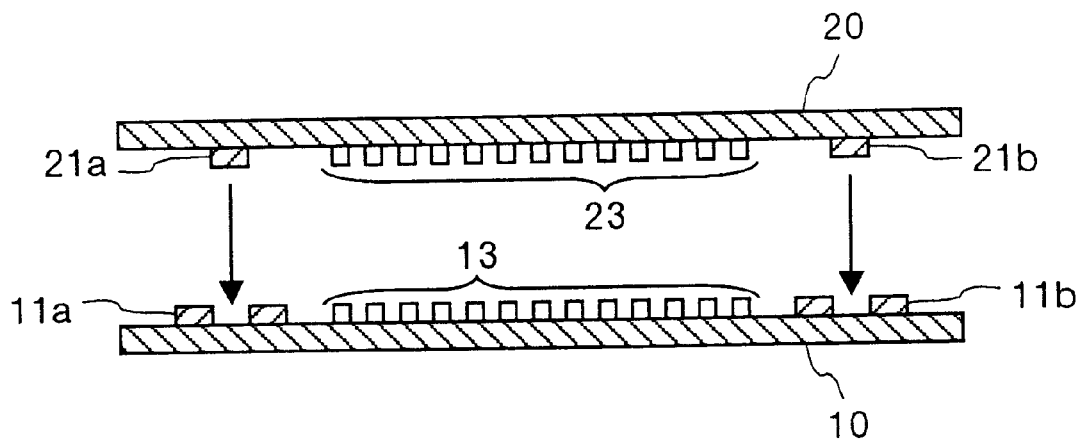
FIG. 4A and FIG. 4B are diagrams for explaining the methods of connecting between printed wiring boards relating to the first embodiment of the present invention.
Figure 4B:
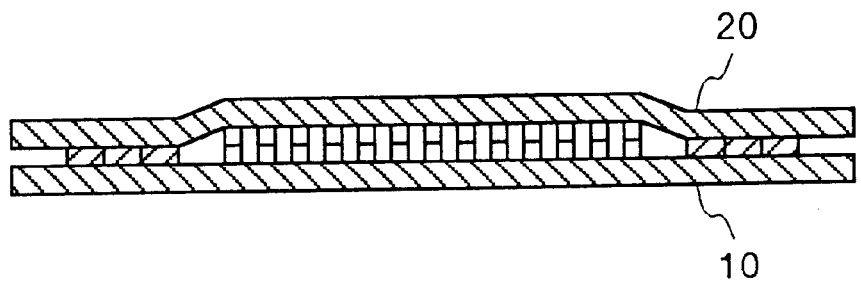

FIG. 4A and FIG. 4B are diagrams for explaining the methods of connecting between printed wiring boards relating to the first embodiment of the present invention. These are cross-sectional views of the printed circuit board 10 and the FPC 20 for explaining the state of the engagement. The connection between the printed circuit board 10 and the FPC 20, and the electrical connection between the electrode pattern 13 and the electrode pattern 23 are achieved by inserting the flanges of the engagement patterns 21a and 21b into the recesses of the engagement patterns 11a and 11b respectively, as shown in FIG. 4A.

However, these engagement patterns are formed by the mask pattern same as the electrode pattern in the same process as explained above. Therefore, the thickness of the engagement patterns is the same as the thickness of the electrode pattern. Accordingly, the thickness formed by mutual engagement between the engagement patterns and the thickness formed by mutual contact between the electrode patterns are different, and the FPC 20 becomes in a bent state from the electrode pattern portion to the engagement pattern portion, as shown in FIG. 4B.

Such a connection is possible when the printed wiring board to be connected with the printed circuit board 10 has flexibility like the FPC. It is not possible to apply the above connection method for connecting other printed wiring board constructed by a substrate having high rigidity. Therefore, it is necessary to devise such that the thickness formed by mutual engagement between the engagement patterns and the thickness formed by mutual contact between the electrode patterns become approximately equal after the engagement between the engagement patterns.

Figure 5A:
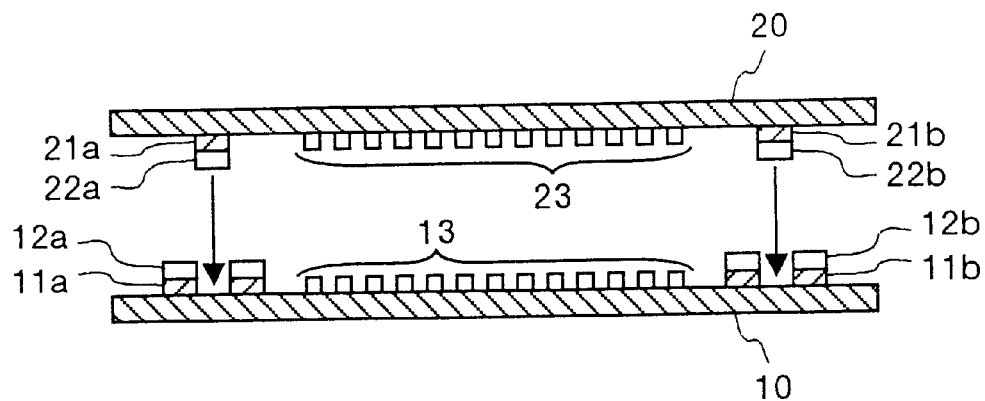
FIG. 5A and FIG. 5B are diagrams for explaining another method of connecting between printed wiring boards relating to the first embodiment of the present invention.
Figure 5B:
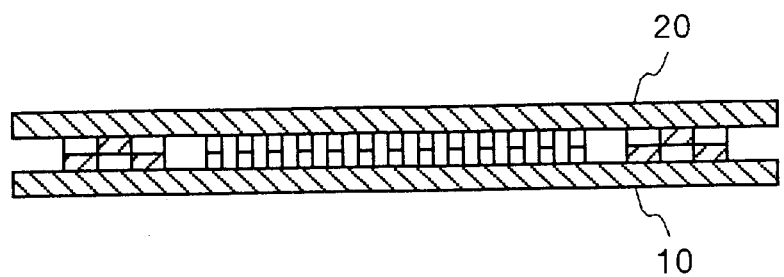

FIG. 5A and FIG. 5B are diagrams for explaining another method of connecting between printed wiring boards relating to the first embodiment. This shows an example of solving the above problem of thickness after the engagement. Specifically, as shown in FIG. 5A, a plating is formed on a top surface (a surface excluding the bottom of the recess) of each of the engagement patterns 11a, 11b, 21a and 21b, thereby adjusting the thickness.

After the electrode patterns are formed by using the mask pattern consisting of the electrode pattern and the engagement pattern, a plating is carried out by using a mask pattern that shows only the pattern of the top surface portions of the engagement patterns. The thickness of the plating is selected in such a manner that the electrode pattern portion and the engagement pattern portion have a uniform thickness in a state that the printed circuit board 10 and the FPC 20 (in this case, the FPC 20 may be other printed wiring board having high rigidity) are connected together, as shown in FIG. 5B.

As explained above, according to the first embodiment, the method of connecting between printed wiring boards and the printed circuit board having printed wiring boards connected by this connection employs the following method. At one end of the printed wiring board 10, the narrow-pitched layout of electrodes (the electrode pattern 13) are formed together with the engagement patterns 11a and 11b made of the same material as that of the electrode pattern 13 near the electrode pattern 13. At one end of the FPC 20 that is connected with the printed circuit board 10, the narrow-pitched layout of electrodes (the electrode pattern 23) are formed together with the engagement patterns 21a and 21b made of the same material as that of the electrode pattern 23 near the electrode pattern 23. The engagement patterns 21a and 21b are engaged with the engagement patterns 11a and 11b with each other. Therefore, it is possible to obtain easily the engagement patterns that have high-precision shapes without separately providing a new process.

When the engagement patterns 11a and 21a are engaged with the engagement patterns 11b and 21b respectively, it is possible to achieve a positioning so as to obtain the electrical connection between the electrode pattern 13 and the electrode pattern 23. Therefore, it is possible to achieve precise and prompt connection between the electrode patterns. This connection method can prevent the occurrence of short-circuiting between electrodes due to inaccurate positioning and the occurrence of a redundant positioning time.

Further, as the top surfaces of the engagement patterns are plated, the thickness of the printed wiring boards after the engagement (that is, after the connection of the electrode patterns) can be made uniform. Therefore, it is also possible to apply the connection method of the present invention to the connection between printed wiring boards that have high rigidity other than the FPCs.

A method of connecting between printed wiring boards and a printed circuit board relating to a second embodiment of the present invention will be explained next.

In the above method of connecting between printed wiring boards and a printed circuit board relating to the first embodiment, engagement patterns are formed in the unused area near the electrode pattern. On the other hand, in the method of connecting between printed wiring boards and a printed circuit board relating to the second embodiment, an electrode pattern constructed by a group of meaningful electrodes is divided into two. Then, an engagement pattern is formed in an area provided between these divided groups of electrodes. In other words, the mask pattern is constructed of the two divided electrode patterns and one engagement pattern positioned between these electrode patterns.

FIG. 6 is a diagram for explaining a method of connecting between printed wiring boards relating to the second embodiment of the present invention. As shown in FIG. 6, two electrode pattern groups 43a and 43b are formed on a printed circuit board 40 with a distance formed between these electrode patterns. One electrode pattern, which is originally recognized as one group of electrodes laid out in equal distances, is divided into these two electrode patterns. One engagement pattern 41 is formed in the area between the two electrode patterns 43a and 43b.

There are also formed electrode patterns 53a and 53b and one engagement pattern 51 on an FPC 50 in order to achieve an electrical connection with the printed circuit board 40 through an engagement between the printed circuit board 40 and the FPC 50. The engagement patterns 41 and 51 have similar shapes to the shapes of the engagement patterns shown in the first embodiment. In FIG. 6, these engagement patterns have a triangular recess and a triangular flange for engagement with each other. It is also possible to take various other shapes as shown in FIG. 3A and FIG. 3B.

It is also possible to plate on the top surfaces of the engagement patterns 41 and 51 to have an increased thickness to achieve a more secure engagement, as explained in the first embodiment.

As shown in FIG. 6, each engagement pattern of the electrode pattern groups 43a and 43b and the electrode pattern groups 53a and 53b has a smaller width than the width determined when the electrodes are laid out in one continuous engagement pattern group. Therefore, it is possible to minimize what is called an accumulated tolerance (for example a distance d1 in the drawing) that is an accumulation of small deviations in distance (tolerance) generated between electrodes. The deviation usually becomes larger when the tolerance is accumulated.

Further, as only one engagement pattern 41 is formed between the electrode pattern groups and only one engagement pattern 51 is formed between the electrode pattern groups, it is possible to minimize the space occupied by the engagement pattern on the printed circuit board 40 and on the FPC 50 respectively. Therefore, it is also possible to have complex shapes of the engagement patterns to achieve a more secure engagement.

As explained above, according to the second embodiment, the method of connecting between printed wiring boards and the printed circuit board having printed wiring boards connected by this connection employs the following method. In the process of forming the electrode pattern on the printed circuit board 40, the electrode pattern is divided into the two electrode pattern groups 43a and 43b, and the engagement pattern 41 is formed at the same time in the area formed between the electrode pattern groups. In the process of forming the electrode pattern on the FPC 50, the electrode pattern is divided into the two electrode pattern groups 53a and 53b, and the engagement pattern 51 is formed at the same time in the area formed between the electrode pattern groups. Therefore, in addition to the effects obtained from the first embodiment, it is possible to decrease the accumulated tolerance of the electrode patterns. Thus, it becomes possible to achieve the pattern forming and the positioning in higher precision. It is also becomes possible to reduce the areas occupied by the engagement patterns. Therefore, it is possible to avoid the pressing of the electrode patterns and the semiconductors mounted on the printed circuit board 40 and the FPC 50.

A method of connecting between printed wiring boards and a printed circuit board relating to a third embodiment of the present invention will be explained next.

In the above methods of connecting between printed wiring boards and a printed circuit board relating to the first and second embodiments, engagement patterns are formed in the shapes to achieve the engagement from the up and down directions. On the other hand, in the method of connecting between printed wiring boards and a printed circuit board relating to the third embodiment, engagement patterns are formed to achieve the engagement in such a way that the upper surfaces of the printed wiring boards are connected in parallel directions (hereinafter to be simply referred to as a lateral direction).

In other words, the upper surfaces of printed wiring boards are brought into contact with each other from the lateral directions so that engagement patterns are engaged with other thereby achieving an electrical connection between electrode patterns.

Figure 7:
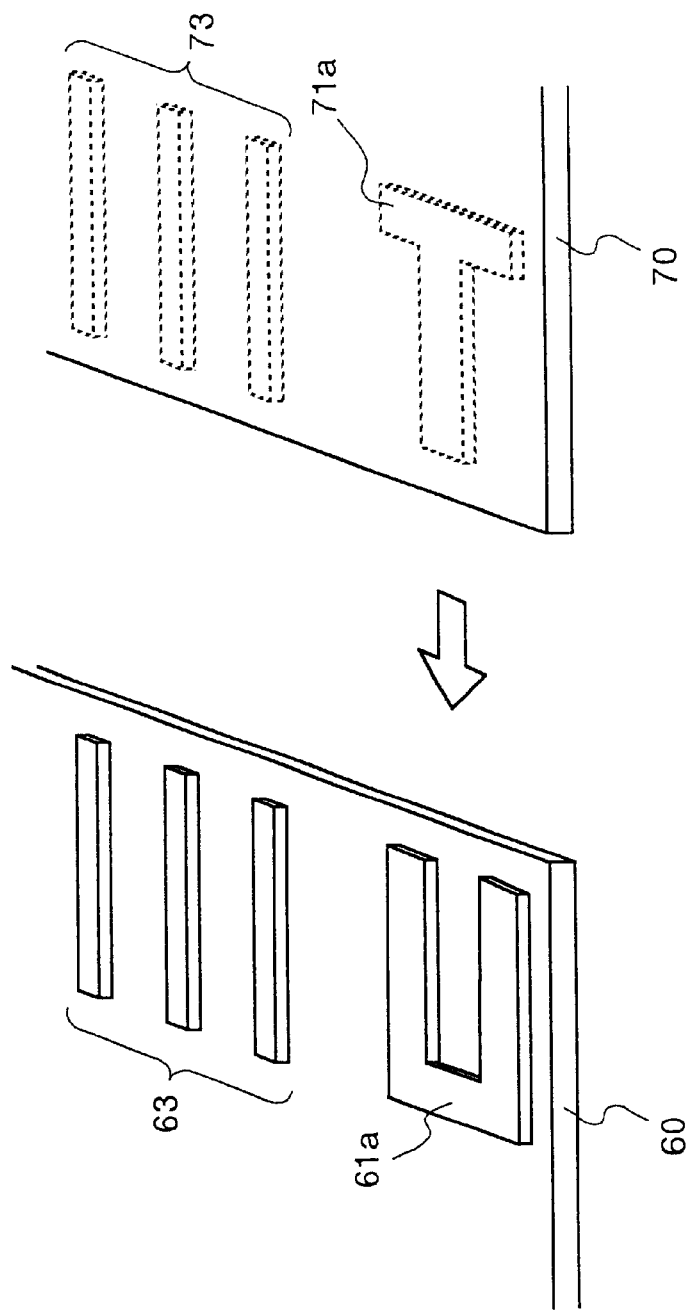
FIG. 7 is a diagram for explaining a method of connecting between printed wiring boards relating to a third embodiment of the present invention.

FIG. 7 is a diagram for explaining a method of connecting between printed wiring boards relating to the third embodiment. As shown in FIG. 7, an engagement pattern 61a is formed near an electrode pattern 63 on a printed circuit board 60, and an engagement pattern 71a is formed near an electrode pattern 73 on an FPC 70, in a similar manner to that of the first embodiment. Similar engagement patterns not shown are also formed at the other end of the electrode patterns 63 and 73 respectively. These engagement patterns at the other ends are omitted from the drawing to simplify the explanation.

As shown in FIG. 7, the electrode pattern 61a has a recess shape in the lateral direction, and the engagement pattern 71a has a flange shape corresponding to the recess. When the recess and the flange are engaged with each other, the engagement patterns 61a and 71a are engaged with each other. At the same time, the electrode patterns 63 and 73 are electrically connected with each other.

Particularly, as the engagement patterns 61a and 71a shown in FIG. 7 make it possible to achieve the lateral engagement between the recess and the flange, it is possible to prevent the electrode pattern 73 of the FPC 70 from being brought into an unprepared deeper contact with the electrode pattern 63.

Figure 8:
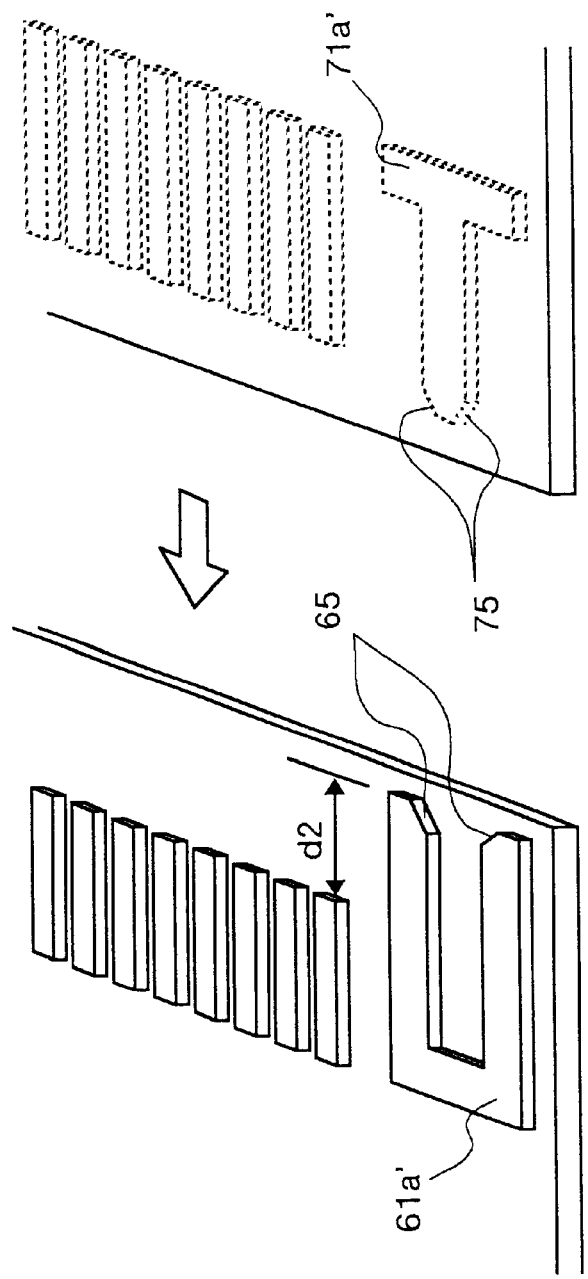
FIG. 8 is a diagram for explaining another method of connecting between printed wiring boards relating to the third embodiment of the present invention.

It is also possible to form tapers 65 at the insertion corners of the recess to have an engagement pattern 61a', and to form tapers 75 at the insertion corners of the flange to have an engagement pattern 71a', as shown in FIG. 8. These tapers will facilitate smooth engagement between the engagement patterns.

Further, when the electrode pattern at the insertion entrance of the engagement pattern 61a' has a shorter length (a distance d2 in the drawing) as shown in FIG. 8, it is possible to avoid an unprepared deeper contact between the electrode patterns when the engagement pattern 71a' is inserted into the engagement pattern 61a' from the lateral direction. This makes it possible to achieve a smooth engagement.

Figure 9:
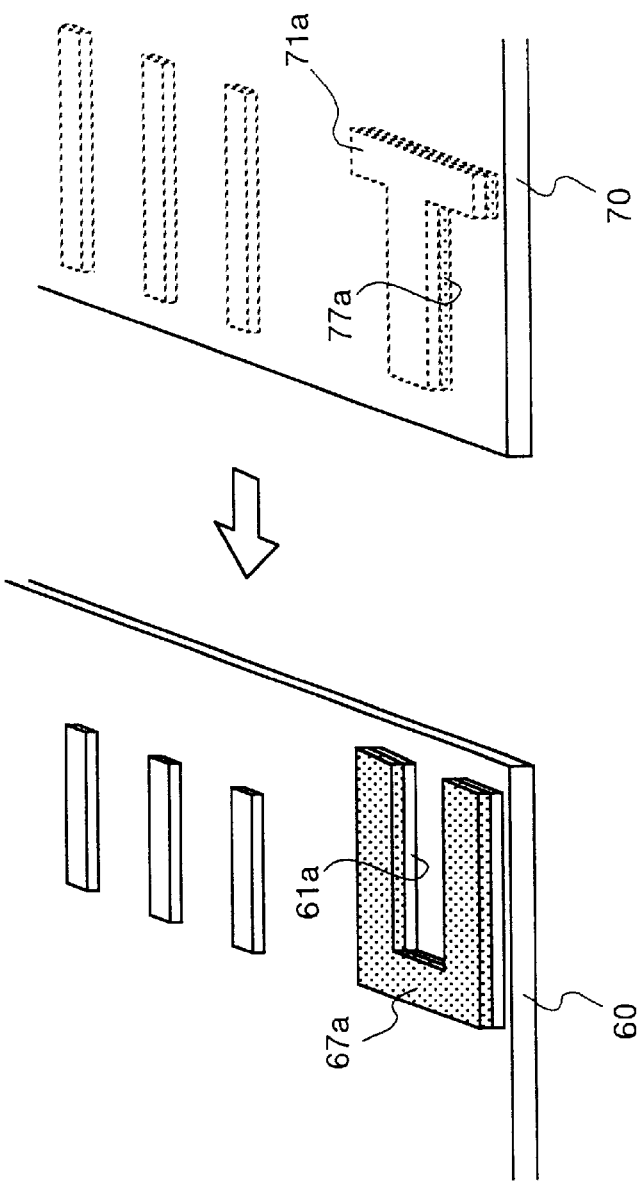
FIG. 9 is a diagram for explaining still another method of connecting between printed wiring boards relating to the third embodiment of the present invention.

Further, as explained in the first embodiment, it is also possible to form recesses and flanges that have a large thickness respectively by plating the top surfaces of the engagement patterns. This makes it easier to achieve a smooth engagement. FIG. 9 is a diagram for explaining this method of connecting between printed wiring boards relating to the third embodiment.

As shown in FIG. 9, a plating 67a is provided on the top surface of the engagement pattern 61a, and a plating 77a is provided on the top surface of the engagement pattern 71a. With this arrangement, it is possible to avoid such an unstable engagement that the flange of the engagement pattern 71a exceeds beyond the thickness of the engagement pattern 61a after the engagement pattern 71a has been inserted into the engagement pattern 61a through the insertion opening.

Figure 10:
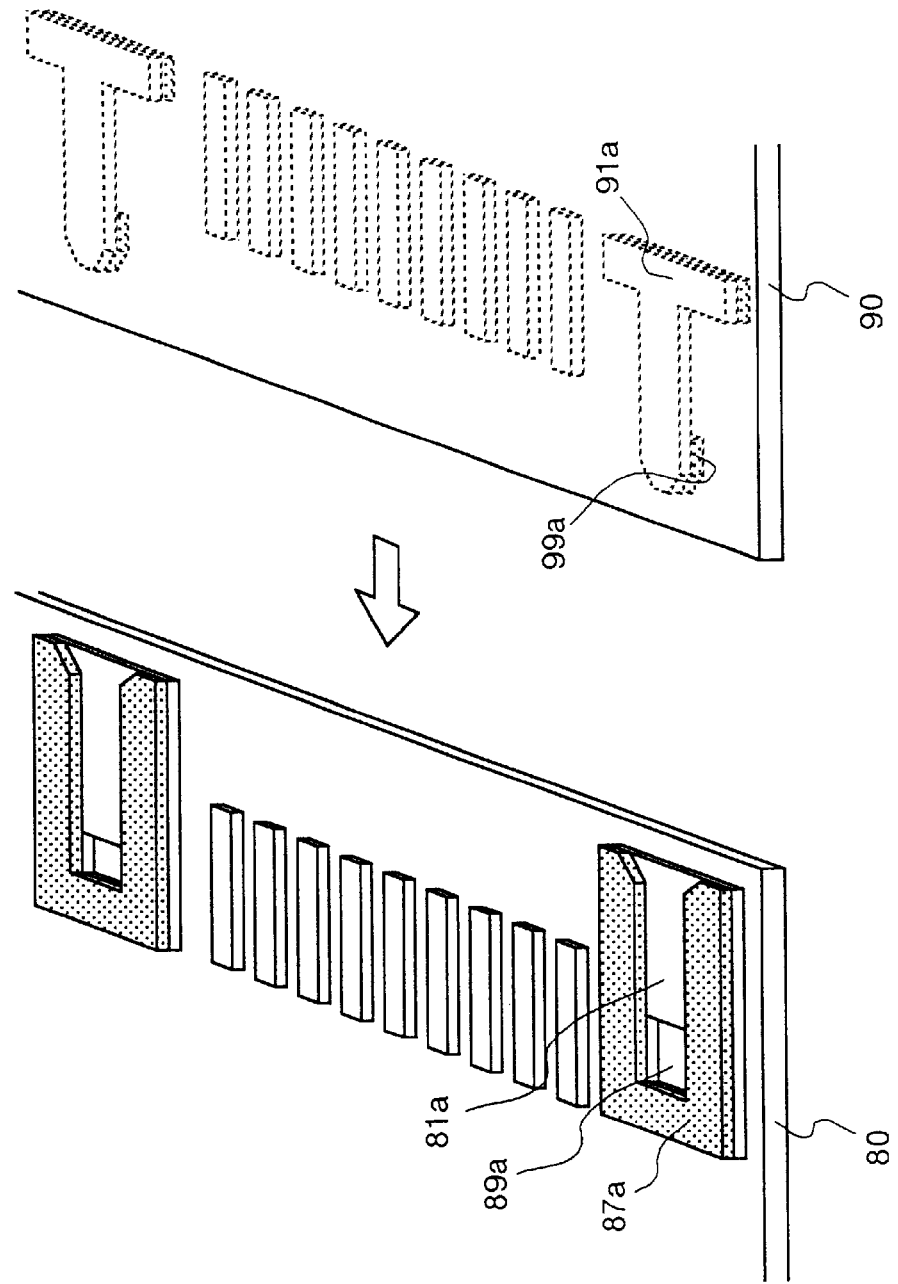
FIG. 10 is a diagram for explaining still another method of connecting between printed wiring boards relating to the third embodiment of the present invention.

It is possible to achieve both examples shown in FIG. 8 and FIG. 9 by mutually combining them or to achieve each example by further using engagement patterns of different shapes. FIG. 10 is a diagram for explaining still another method of connecting between printed wiring boards. In FIG. 10, on a printed circuit board 80, there is formed an engagement pattern 81a made of the same material as that of the electrode pattern to have a recess 89a in up and down directions like that of the first embodiment, instead of the recess being formed in the lateral direction. A plating 87a formed on the top surface of the engagement pattern 81a has a recess shape in a lateral direction.

On the other hand, on an FPC 90, there is formed an engagement pattern 91a in a projection made of the same material as that of the electrode pattern, and a flange 99a is formed on this engagement pattern 91a to achieve an engagement with the recess 89a in up and down directions.

The engagement patterns 81a and 91a are engaged with each other as follows. The engagement pattern 91a is inserted into the engagement pattern 81a from the lateral direction by using the plating 87a as a guide rail. Then, the flange 99a is engaged with the recess 89a from up and down directions. Based on the engagement between the flange 99a and the recess 89a that has been achieved in up and down directions, the engagement will not be disengaged by force applied from lateral directions. As a result, a more secure engagement can be achieved.

As explained above, according to the third embodiment, the method of connecting between printed wiring boards and the printed circuit board having printed wiring boards connected by this connection method employs the following method. In the process of forming the electrode pattern on the printed circuit board 60, the engagement pattern 61a that can be engaged from the lateral direction is formed at the same time near the electrode pattern 63. In the process of forming the electrode pattern on the FPC 70, the engagement pattern 71a that can be engaged from the lateral direction is formed at the same time near the electrode pattern 73. Therefore, it is possible to easily obtain engagement patterns having high-precision shapes without separately providing a new process.

Further, the tapers are provided at the entrance of the engagement pattern 61a to have the engagement pattern 61a', and the plating is formed on the top surface of the engagement pattern 61a. Similarly, the tapers are provided at the projection of the engagement pattern 71a to have the engagement pattern 71a', and the plating is formed on the top surface of the engagement pattern 71a. With this arrangement, it is possible to carry out a smoother engagement between the engagement patterns.

Further, on the printed circuit board 80, there is formed the engagement pattern 81a constructed of the recess 89a that achieves the engagement from the up and down directions and the plating 87a that achieves the engagement from the lateral direction. On the FPC 90, there is also formed the engagement pattern 91a having the flange 99a that achieves the engagement from the up and down directions. As a result, the engagement can be achieved from the up and down directions as well as from the lateral direction. Therefore, it is possible to keep a more secure state of engagement.

A method of connecting between printed wiring boards and a printed circuit board relating to a fourth embodiment of the present invention will be explained next.

According to the method of connecting between printed wiring boards relating to the fourth embodiment, engagement patterns are formed by plating such as an electrolytic Au plating or a solder plating onto a part of electrode patterns of two printed wiring boards for achieving an electrical connection. At the time of connecting both printed wiring boards, the engagement patterns are engaged with each other. The engagement patterns formed by plating onto the electrode patterns form one shape in total.

Figure 11:
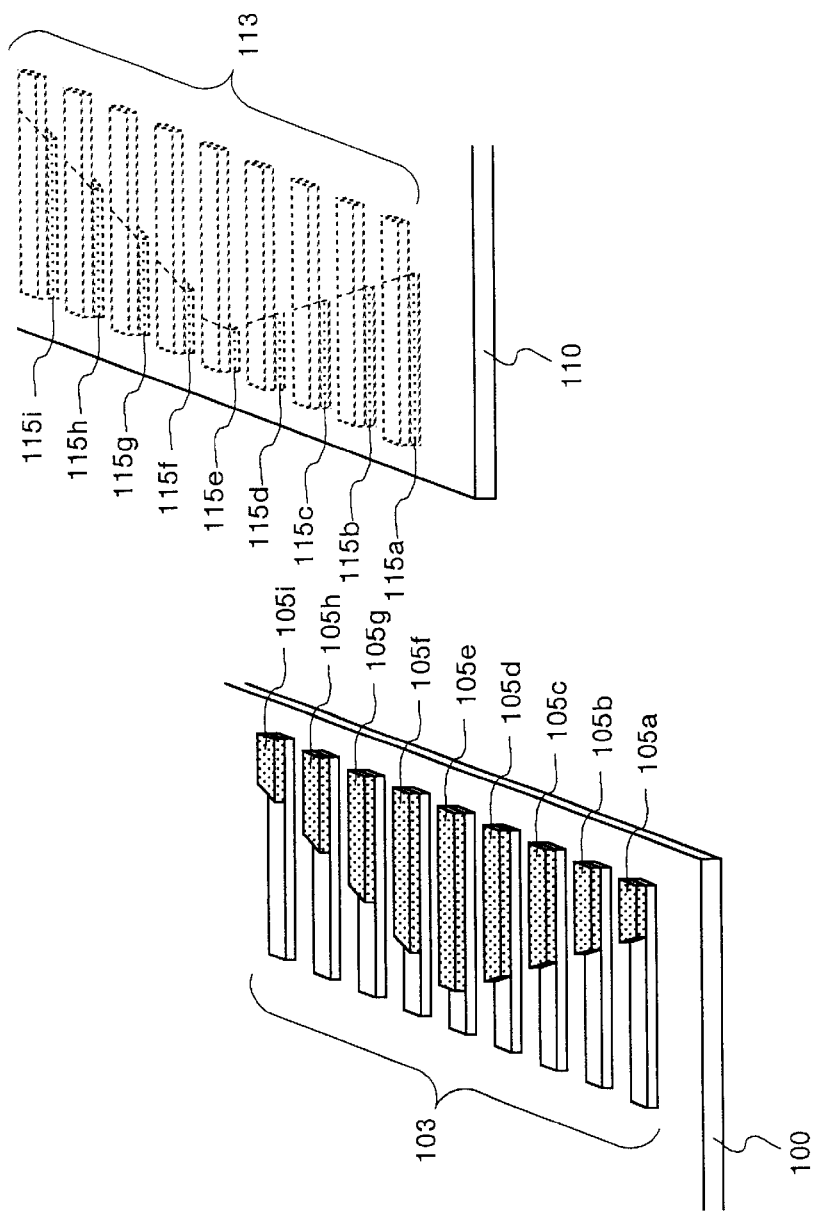
FIG. 11 is a diagram for explaining a method of connecting between printed wiring boards relating to a fourth embodiment of the present invention.

FIG. 11 is a diagram for explaining a method of connecting between printed wiring boards relating to the fourth embodiment. As shown in FIG. 11, there is formed an electrode pattern 103 having a layout of a plurality of electrodes, on a printed circuit board 100. There are further formed engagement patterns 105a to 105i by plating on this electrode pattern 103.

The engagement patterns 105a to 105i form one meaningful shape as a total as shown in the drawing. For example, the engagement pattern 105a and the engagement pattern 105b have different lengths and different edge shapes from each other on the respective electrodes. Particularly, the total edge line of the engagement patterns 105a to 105i formed by the connection of these engagement patterns is required to form at least one curve or one angle. These engagement patterns 105a to 105i cover their respective parts on the electrodes. In order to provide stages for achieving the engagement, each electrode of the engagement pattern 103 is required to have an exposed part.

On the other hand, engagement patterns 115a to 115i are similarly formed by plating on an electrode pattern 113 on an FPC 110. However, the engagement patterns 115a to 115i need to have the same edge line as that formed by the total engagement patterns 105a to 105i so that the engagement patterns 115a to 115i can be engaged with the exposed parts of the electrode pattern 103.

Based on this construction, the printed circuit board 100 can be connected with the FPC 110 when the engagement patterns 105a to 105i of the printed circuit board 100 are engaged with the exposed parts of the FPC 110, that is, the parts of the electrode pattern 113 not covered by the engagement patterns, from up and down directions. In other words, this engagement is achieved by the engagement between the exposed electrode pattern 103 not covered by the engagement patterns on the printed circuit board 100 and the engagement patterns 115a to 115i on the FPC 110.

As explained above, according to the fourth embodiment, the method of connecting between printed wiring boards and the printed circuit board having printed wiring boards connected by this connection method employs the following method. The engagement patterns 105a to 105i are formed by plating on the electrode pattern 103 on the printed circuit board 100. Similarly, the engagement patterns 115a to 115i are formed by plating on the electrode pattern 113 on the FPC 110. These engagement patterns are engaged from up and down directions. Based on this engagement, the exposed parts of the electrode pattern 103 are electrically connected with the exposed parts of the electrode pattern 113. The engagement patterns 105a to 105i made of metal are also electrically connected with the engagement patterns 115a to 115i made of metal. Therefore, it is not necessary to secure a special area for forming the engagement patterns other than the areas in which the electrode patterns are disposed. It is also possible to easily carry out a high-precision positioning.

A method of connecting between printed wiring boards and a printed circuit board relating to a fifth embodiment of the present invention will be explained next.

Usually, a solder resist (that is, a covering material on the conductor pattern) is coated on the surface of the printed wiring board excluding the portion where the electrode pattern is exposed. According to a method of connecting between printed wiring boards relating to the fifth embodiment, an edge of the end of the solder resist, that is, the edge of the end at the electrode pattern side, has a rugged part in a lateral direction. This edge is engaged with an end of a solder resist of the other printed wiring board on which a similar rugged part has been formed.

Figure 12:
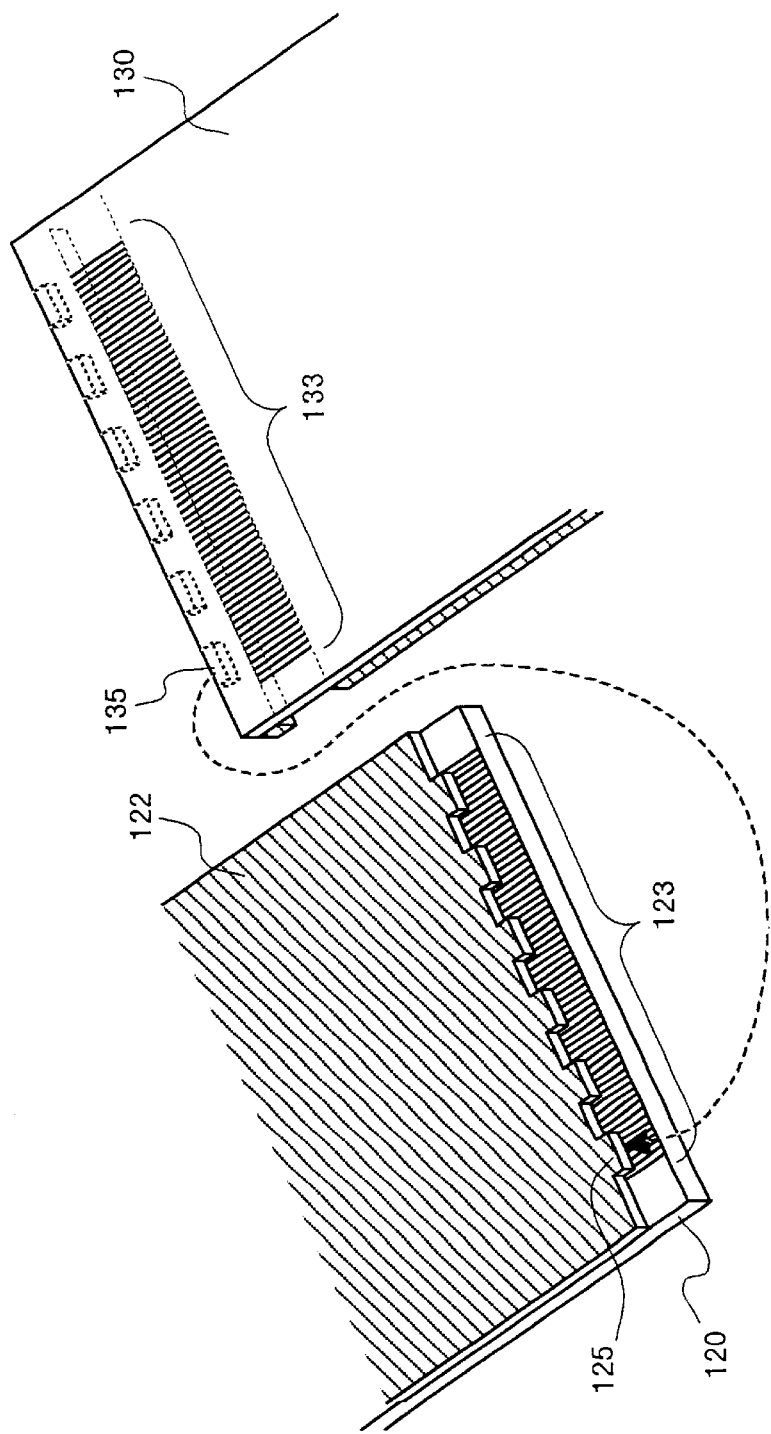
FIG. 12 is a diagram for explaining a method of connecting between printed wiring boards relating to a fifth embodiment of the present invention.

FIG. 12 is a diagram for explaining a method of connecting between printed wiring boards relating to the fifth embodiment. As shown in FIG. 12, a solder resist 122 having the rugged part is formed on a printed circuit board 120. A solder resist having the rugged part is also formed on an FPC 130. When a flange 125 of the solder resist on the printed circuit board 120 is engaged in a lateral direction with a recess 135 of the solder resist on the FPC 130, for example, it is possible to obtain an electrical connection between an electrode pattern 123 and an electrode pattern 133.

The above rugged part can be obtained at the end of the solder resist as follows. In the process of coating a solder resist, a mask pattern for forming this rugged shape is disposed on an electrode pattern, and a solder resist is coated onto the area excluding this mask pattern. It is also possible to form the rugged part by etching after a solder resist having a normal straight-line edge has been formed.

As explained above, according to the fifth embodiment, the method of connecting between printed wiring boards and the printed circuit board having printed wiring boards connected by this connection method employs the following method. The rugged part is formed at the end of the solder resist covered on the printed circuit board 120. Similarly, the rugged part is formed at the end of the solder resist covered on the FPC 130. These rugged parts of the solder resists are engaged with each other to obtain electrical connection between the electrode pattern 123 and the electrode pattern 133. Therefore, it is not necessary to secure a special area for forming the engagement patterns other than the areas in which the electrode patterns are disposed. It is also possible to easily carry out a high-precision positioning.

A method of connecting between printed wiring boards and a printed circuit board relating to a sixth embodiment of the present invention will be explained next.

According to the method of connecting between printed wiring boards relating to the sixth embodiment, a connector is provided on the electrode pattern of one of the printed wiring boards that have the constructions as shown in the first to the fifth embodiments. The other electrode pattern that has been positioned is fixed by this connector.

Figure 13:
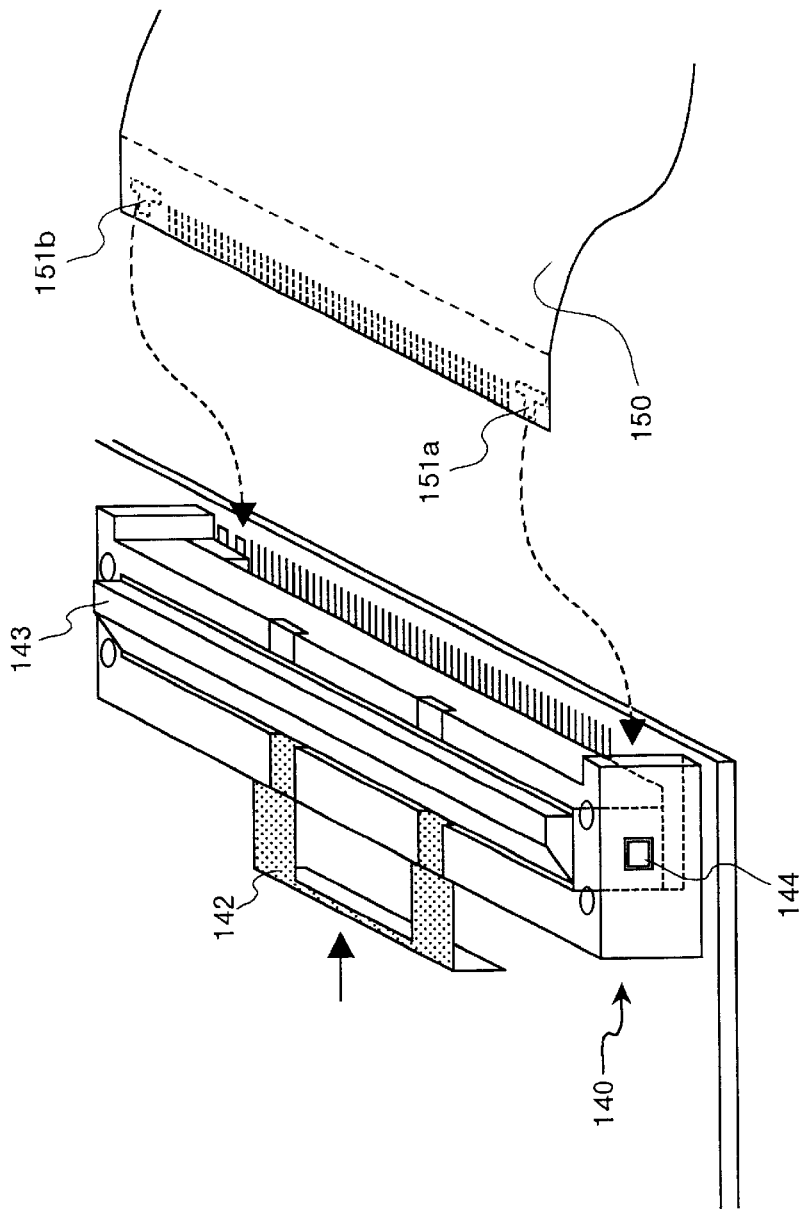
FIG. 13 is a diagram for explaining a method of connecting between printed wiring boards relating to a sixth embodiment of the present invention.

FIG. 13 is a diagram for explaining a method of connecting between printed wiring boards relating to the sixth embodiment. As shown in FIG. 13, a connector 140 installed on an electrode pattern on a printed circuit board has a reception opening for inserting an FPC 150. When a lever 142 is inserted along a direction shown by an arrow in the drawing, a pressing part 143 is pressed down toward the electrode pattern so that the FPC 150 positioned as explained in the first to the fifth embodiments can be fixed.

The FPC 150 has engagement patterns 151a and 151b that have shapes for achieving an engagement in the lateral direction as explained in the third embodiment. Similarly, shapes for achieving the engagement with the above engagement pattern are also provided on a printed circuit board.

Figure 14A:
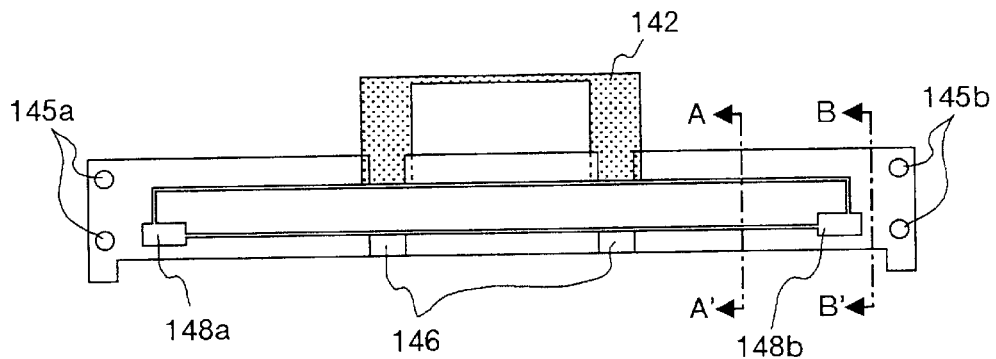
FIG. 14A to FIG. 14C are diagrams for explaining a connector in the method of connecting between printed wiring boards relating to the sixth embodiment of the present invention.
Figure 14B:
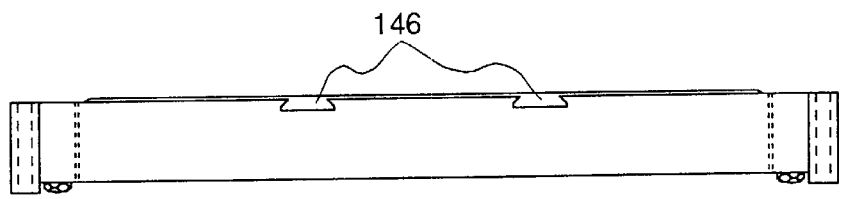
Figure 14C:
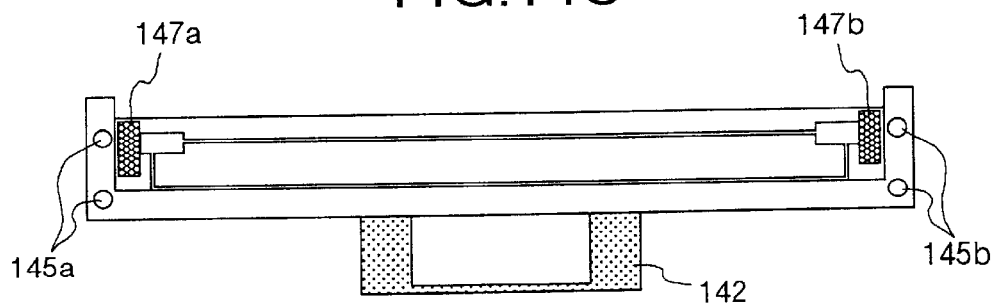
Figure 15A:
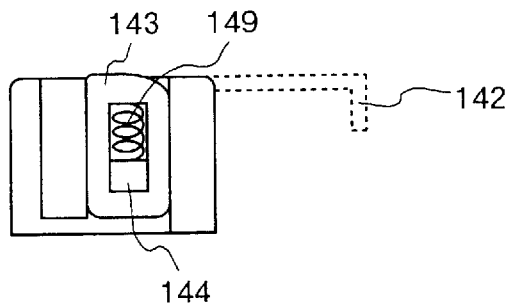
FIG. 15A to FIG. 15C are cross-sectional diagrams for explaining the method of connecting between printed wiring boards relating to the sixth embodiment of the present invention.
Figure 15B:
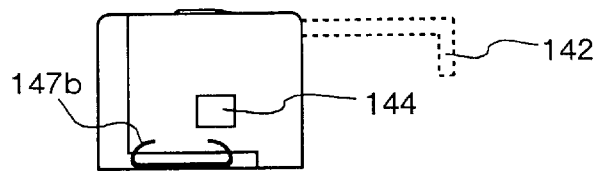

FIG. 14A to FIG. 14C and FIG. 15A to FIG. 15C are diagrams for explaining a connector in the method of connecting between printed wiring boards relating to the sixth embodiment. FIG. 14A is a top plan view of the connector, FIG. 14B is a front view of the connector, and FIG. 14C is a bottom plan view of the connector. FIG. 15A is a cross-sectional view of the connector cut along an A–A' line of FIG. 14A, and FIG. 15B is a cross-sectional view of the connector cut along a B–B' line of FIG. 14A.

The connector 140 is installed on the printed circuit board by using screws that are inserted into screw holes 145a and 145b as shown in FIG. 14A. Confirmation windows 148a and 148b are provided above the electrode patterns. Through these confirmation windows, it is possible to confirm the positioning of the electrode patterns and to adjust the engagement between the engagement patterns.

When the lever 142 is pressed down, a header of the pressing part 143 shown in FIG. 15 is also pressed down toward the direction of the electrode patterns. At the same time, ends of the pressing part 143 are guided to guide grooves 146. In a normal state, the pressing part 143 is pressed upward by a spring member 149 of which one end has been fixed to an axis 144, as shown in FIG. 15A.

Figure 15C:
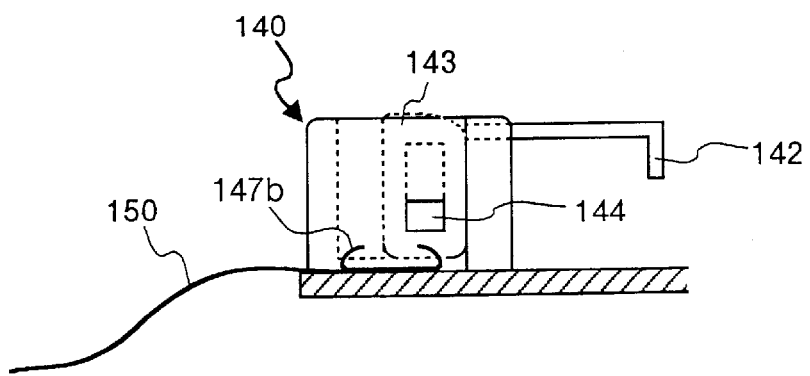

At the lower side of the connector 140, there are provided leaf springs 147a and 147b for provisionally fixing the engagement patterns 151a and 151b or the electrode pattern of the FPC 150 to be inserted, as shown in FIG. 14C and FIG. 15B. These leaf springs 147a and 147b are usually pressing the printed circuit board, and the FPC 150 is inserted into the gap between the leaf springs and the printed circuit board, as shown in FIG. 15C.

A leaf rubber is provided on the lower surface of the pressing part 143, that is, on the surface that is in contact with the upper surface of the FPC 150. The whole lower surface keeps a close contact with the upper surface of the FPC 150, and also prevents the inserted FPC 150 from being easily released.

As explained above, according to the sixth embodiment, the method of connecting between printed wiring boards employs the following method. On the printed circuit board, there is provided the connector that includes the leaf springs 147a and 147b for provisionally fixing the FPC 150, and the pressing part 143 that is pressed down onto the printed circuit board by the lever 142 to fix the FPC 150. Therefore, in the methods of connecting between the printed wiring boards as structured in the first to the fifth embodiments, it is easy to securely fix the connection between the printed wiring boards after their positioning.

As explained above, according to one aspect of the present invention, in connecting between printed wiring boards, there is formed an engagement pattern near a narrow-pitched electrode pattern on each printed wiring board, the engagement pattern being made of the same material as that of an electrode pattern. Based on this arrangement, when the engagement patterns are engaged with each other, it is possible to position the electrode patterns to obtain electrical connection with each other. Therefore, it is possible to achieve a precise and prompt connection between the electrode patterns. This connection method can prevent the occurrence of short-circuiting between electrodes due to inaccurate positioning or the occurrence of a redundant positioning time.

Further, according to another aspect of the present invention, in connecting between printed wiring boards, there is formed by plating an engagement pattern on a part of a narrow-pitched electrode pattern on each printed wiring board. When the engagement patterns are engaged with each other, it is possible to position the electrode patterns so that the non-plated parts of the electrode patterns can be electrically connected and the engagement patterns can be electrically connected with each other. Therefore, it is not necessary to secure a special area for forming the engagement patterns other than the areas in which the electrode patterns are disposed. It is also possible to easily carry out a high-precision positioning.

According to still another aspect of the present invention, in connecting between printed wiring boards, there is formed a covering material that covers an upper surface of a printed wiring board other than a portion of the surface where a narrow-pitched electrode pattern is electrically connected so that the end of the covering material positioned at the electrode pattern side has a rugged part in a direction parallel with the surface of the printed wiring board. When the rugged parts of the two printed wiring boards are engaged with each other, it is possible to position the electrode patterns so as to obtain an electrical connection between the electrode patterns. Therefore, it is not necessary to secure a special area for forming the engagement patterns other than the areas in which the electrode patterns are disposed. It is also possible to easily carry out a high-precision positioning.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of connecting between printed wiring boards comprising:

a first process of forming a first electrode pattern at one end of a first printed wiring board and forming a first engagement pattern near the first electrode pattern, said first engagement pattern being made of the same material as that of the first electrode pattern and formed by the same process as that of the first electrode pattern;

a second process of forming a second electrode pattern at one end of a second printed wiring board and forming a second engagement pattern near the second electrode pattern, said second engagement pattern being made of the same material as that of the second electrode pattern of be and formed by the same process as that of the second electrode pattern, said second engagement pattern being engageable with said first engagement pattern; and a positioning step of engaging said first engagement pattern with said second engagement pattern so that
said first electrode pattern and said second electrode pattern are positioned to have an electrical connection with each other, and
said engagement patterns, made of the same material and formed by the same process as that of the electrode patterns, are the sole means of aligning the first printed wiring board with the second printed wiring board.

2. The method of connecting between printed wiring boards according to claim 1, wherein
the first process includes forming said first engagement pattern to have a recess in a thickness direction of said first electrode pattern,
the second process includes forming said second engagement pattern to have a flange in a thickness direction of said second electrode pattern, and
the positioning step includes a process of engaging said recess with said flange in a direction in which the surface of said first printed wiring board and the surface of said second printed wiring board face each other so that said first electrode pattern is electrically connected with said second electrode pattern.

3. The method of connecting between printed wiring boards according to claim 1, wherein
the first process includes forming said first engagement pattern to have a recess in a direction parallel with a surface of said first printed wiring board,
the second process includes forming said second engagement pattern to have a flange in a direction parallel with a surface of said second printed wiring board, and
the positioning step includes a process of engaging said recess with said flange in a direction mutually along the surface of said first printed wiring board and the surface of said second printed wiring board respectively so that said first electrode pattern is electrically connected with said second electrode pattern.

4. The method of connecting between printed wiring boards according to claim 1, further comprising:
a first plating step of forming a plating on a top surface of said first engagement pattern to have said first engagement pattern in a plated state; and
a second plating step of forming a plating on a top surface of said second engagement pattern to have said second engagement pattern in a plated state, wherein
the thickness of the plating is made such that a sum of the thickness of said first engagement pattern and said second engagement pattern formed by the mutual engagement in the positioning process becomes approximately equal to a sum of the thickness of the first electrode pattern and the second electrode pattern.

5. The method of connecting between printed wiring boards according to claim 1,
wherein the positioning step further includes as pre-processes,
a fixing-unit setting step of setting a printed wiring board fixing unit, including a first pressing section made of a first elastic unit that presses the first printed circuit board, a second pressing section that is pressed upward by a second elastic unit above the first electrode pattern, and a lever that presses down the second pressing section toward the first electrode pattern; and
an insertion step of inserting said second electrode pattern of said second printed wiring board between said first pressing section and said first electrode pattern, and
the positioning step further includes as post-processes,
a fixing step of pressing down said second pressing section by the operation of said lever to fix said second printed wiring board onto said first printed wiring board.

6. A method of connecting between printed wiring boards comprising:
a first plating step of forming first plated patterns by plating on a part of first electrode patterns at one end of a first printed wiring board, thereby forming first non-plated parts on the other part of said first electrode patterns;
a second plating step of forming second plated patterns by plating on a part of second electrode patterns at one end of a second printed wiring board, thereby forming second non-plated parts on the other part of said second electrode patterns; and
a positioning step of engaging said first plated patterns with said second non-plated parts and engaging said second plated patterns with said first non-plated parts.

7. The method of connecting between printed wiring boards according to claim 6,
wherein the positioning step further includes as pre-processes,
a fixing-unit setting step of setting a printed wiring board fixing unit, including a first pressing section made of a first elastic unit that presses the first printed circuit board, a second pressing section that is pressed upward by a second elastic unit above the first electrode pattern, and a lever that presses down the second pressing section toward the first electrode pattern; and
an insertion step of inserting said second electrode pattern of said second printed wiring board between said first pressing section and said first electrode pattern, and
the positioning step further includes as post-processes,
a fixing step of pressing down said second pressing section by the operation of said lever to fix said second printed wiring board onto said first printed wiring board.

8. A method of connecting between printed wiring boards, comprising:
a first covering-material forming step of forming a covering material at one end of a first printed wiring board, which covering material covers an upper surface of said first printed wiring board other than a portion of the surface where a first electrode pattern is electrically connected so that one end of the covering material positioned at said first electrode pattern side has a first rugged part in a direction parallel with the surface of said first printed wiring board;
a second covering-material forming step of forming a covering material at one end of a second printed wiring board, which covering material covers an upper surface of said second printed wiring board other than a portion of the surface where a second electrode pattern is electrically connected so that one end of the covering material positioned at said second electrode pattern side has a second rugged part in a direction parallel with the surface of said second printed wiring board; and
a positioning step of engaging said first rugged part with said second rugged part to position said electrode patterns so that the first electrode pattern is electrically connected with the second electrode pattern.

9. The method of connecting between printed wiring boards according to claim 8, wherein the positioning step further includes as pre-processes, a fixing-unit setting step of setting a printed wiring board fixing unit, including a first pressing section made of a first elastic unit that presses the first printed circuit board, a second pressing section that is pressed upward by a second elastic unit above the first electrode pattern, and a lever that presses down the second pressing section toward the first electrode pattern; and an insertion step of inserting said second electrode pattern of said second printed wiring board between said first pressing section and said first electrode pattern, and the positioning step further includes as post-processes, a fixing step of pressing down said second pressing section by the operation of said lever to fix said second printed wiring board onto said first printed wiring board.

10. Printed circuit boards comprising:

a first engagement pattern provided near a first electrode pattern on a first printed circuit board, said first engagement pattern being made of the same material as that of said first electrode pattern; and a second engagement pattern provided near a second electrode pattern on a second printed circuit board, said second engagement pattern being made of the same material as that of said second electrode pattern, and said second engagement pattern being engageable with said first engagement pattern, wherein said first engagement pattern is engaged with said second engagement pattern so that said first electrode pattern is electrically connected with said second electrode pattern.

11. Printed circuit boards comprising:

first plated patterns provided by plating on a part of first electrode patterns on a first printed circuit board, thereby automatically forming first non-plated parts on the other part of said first electrode patterns; and second plated patterns provided by plating on a part of second electrode patterns on a second printed circuit board, thereby automatically forming second non-plated parts on the other part of said second electrode patterns, wherein said first plated patterns are engaged with said second non-plated parts and said second plated patterns are engaged with said first non-plated parts.

12. Printed circuit boards comprising:

a first printed wiring board covered with a covering material that covers an upper surface of said first printed wiring board other than a portion of the surface where a first electrode pattern is electrically connected, with one end of the covering material positioned at said first electrode pattern side having a first rugged part in a direction parallel with the surface of said first printed wiring board; and a second printed wiring board covered with a covering material that covers an upper surface of said second printed wiring board other than a portion of the surface where a second electrode pattern is electrically connected, with one end of the covering material positioned at said second electrode pattern side having a second rugged part in a direction parallel with the surface of said second printed wiring board, wherein said first rugged part is engaged with said second rugged part so that said first electrode pattern is electrically connected with said second electrode pattern.

* * * * *